United States Patent [19]

Pernisz et al.

[11] Patent Number: 5,293,335

[45] Date of Patent: Mar. 8, 1994

[54] CERAMIC THIN FILM MEMORY DEVICE

[75] Inventors: Udo C. Pernisz; Keith W. Michael; Loren A. Haluska, all of Midland, Mich.

[73] Assignee: Dow Corning Corporation, Midland, Mich.

[21] Appl. No.: 988,046

[22] Filed: Dec. 9, 1992

Related U.S. Application Data

[63] Continuation-in-part of Ser. No. 915,572, Jul. 20, 1992.

[51] Int. Cl.$^5$ .............................................. G11C 11/56
[52] U.S. Cl. ........................................ 365/148; 365/163; 365/174; 257/2; 257/5
[58] Field of Search .................... 365/148, 163, 174; 257/2, 5

[56] References Cited

U.S. PATENT DOCUMENTS

| | | | |
|---|---|---|---|
| 3,149,398 | 9/1964 | Sprague | 29/25 |
| 3,271,591 | 9/1966 | Ovshinsky | 307/88 |
| 3,644,741 | 2/1972 | Ovshinsky | 250/213 |
| 3,823,331 | 7/1974 | Fritzsche et al. | 257/2 |
| 3,827,033 | 7/1974 | Quilliam | 257/5 |
| 3,953,375 | 4/1976 | Nagano | 252/520 |
| 4,052,340 | 10/1977 | Einthoven | 252/518 |
| 4,205,387 | 5/1980 | Ovshinsky | 364/900 |
| 4,684,972 | 8/1987 | Owen | 357/59 |
| 4,756,977 | 7/1988 | Haluska | 428/704 |
| 4,795,657 | 1/1989 | Formiboni et al. | 365/163 |
| 4,818,717 | 4/1989 | Johnson | 437/52 |
| 5,151,384 | 9/1992 | Williams | 437/170 |

FOREIGN PATENT DOCUMENTS

WO9000826 1/1990 PCT Int'l Appl. .
1419834 12/1975 United Kingdom ................ 365/148

OTHER PUBLICATIONS

H. Fritzsche, "Physics of Instabilities in Amorphous Semiconductors," IBM J. Res. Develop., Sep. 1969, pp. 515–521.
R Neale et al., "The Application of Amorphous Materials to Computer Memories," IEEE Trans. on Elec. Dev., vol. ED-20, No. 2, Feb. 1973, pp. 195–205.
Bullot et al., Physica Status Solidi, (a) 71, K1–K4 (1982), "Threshold Switching in $V_2$ or Layers . . . ".
Ansari et al., Journal of Physics, D: Applied Physics 20, (1987), pp. 1063–1066, "Pre-and Post-Threshold Conduction Mechanisms in Thermally Grown Titanium Oxide Films".
Ramesham et al., NASA Tech Briefs, Dec. 1989, p. 28, "Memory Switches Based on $MnO_{2-x}$ Thin Films".
Morgan et al., Thin Solid Films, 15 (1973) pp. 123–131, "Electroforming and Dielectric Breakdown . . . ".
Simmons, Handbook of Thin Film Technology, Chapter 14 (1970) pp. 14–38 to 14–43, "Negative Resistance and Memory Effects".
Al-Ismail et al., Journal of Material Science, 20 (1985) pp. 2186–2192, "Forming, Negative-Resistance, . . . ".
Morgan et al., Thin Solid Films, 20, (1974), pp. S7–S9, "Threshold and Memory Switching in Silicon Oxide Films".
Boelle et al., Applied Surface Science, 46, (1990) pp. 200–205, "Sol-Gelow-Temp. Prep. of Silica Films; . . . ".
Klein et al, Journal of Applied Physics, vol. 40, No. 7, Jun. (1969), pp. 2728–2740, "Electrical Pulse Breakdown of Silicon Oxide Films".

Primary Examiner—Joseph E. Clawson, Jr.
Attorney, Agent, or Firm—James L. DeCesare; Roger E. Gobrogge

[57] ABSTRACT

A digital memory circuit for electronic applications. The circuit has at least one memory element connected in series with a load resistor. The digital memory circuit also includes a voltage supply and a data output terminal. The memory element in the digital memory circuit is in the form of a silicon dioxide film derived from a hydrogen silsesquioxane resin. The silicon dioxide film is characterized by a jV curve which includes both resistive and conductive regions for the memory element.

30 Claims, 6 Drawing Sheets

5,293,335

CERAMIC THIN FILM MEMORY DEVICE

This is a continuation-in-part of copending application Ser. No. 07/915572 filed on Jul. 20, 1992.

BACKGROUND OF THE INVENTION

This invention is directed to threshold switching devices which exhibit negative differential resistance (NDR), and to certain ceramic threshold switching devices which are useful as thin film memory devices.

Devices which exhibit threshold switching, and metal oxide devices which exhibit threshold switching with negative differential resistance (NDR) are known in the art. The switching and negative differential resistance (NDR) characteristics of silicon oxide films has also been described in the literature.

The use of thin film silica coatings derived from hydrogen silsesquioxane resin to provide protection and electrical insulation is not new, but the use of those coatings to form switching devices which are useful as thin film memory devices is believed to be novel.

Coatings and switching devices formed by depositing a thin hydrogen silsesquioxane derived silicon dioxide film between at least two electrodes and applying a voltage above a threshold voltage across the electrodes, are described in detail in a prior copending patent application U.S. Ser. No. 07/694721 filed May 2, 1991, and entitled "Threshold Switching Devices". The present invention involves these and similar devices and their utility in thin film memory applications.

Memory arrays containing thin film memory devices according to the present invention offer the advantage that information can be retained without a holding voltage, i.e. true non-volatile memory. Further, it is possible to employ simplified metallization patterns because there is only one active element plus one passive element which is the load resistor. In addition, simplified address and read/write line patterns can be used.

State of the art static random access memory (RAM) cell arrangements typically require a supply voltage connection for memory retention; two cross-coupled transistors for the storage of 0 and 1, and 1 and 0; two load resistors; two access transistors controlled by the same wordline; and two bit lines, one for 0 and the other for 1. In contrast, the static RAM cell of the present invention containing the hydrogen silsesquioxane resin-derived silica switching cell offers the benefits that no permanent power supply is required, and that there is no power dissipated in the memory cell. Further, only one storage cell and one load resistor are necessary. In addition, only one access transistor is needed for WORD SELECT; and only one bit line is necessary for BIT SELECT for writing with voltage pulse and for reading data.

SUMMARY OF THE INVENTION

The present invention relates to a method of forming a threshold switching device having negative differential resistance (NDR). The method comprises depositing a non-dense silicon dioxide film derived from hydrogen silsesquioxane resin between at least two electrodes. A voltage above a certain threshold voltage is then applied across the electrodes to complete formation of the device.

The device formed in this manner is characterized in that (i) the conductive state of the thin film can be converted to the resistive state with memory by decreasing the applied voltage from a sufficiently high value to a value below the threshold voltage at a sufficiently high rate, (ii) it can be converted from a resistive state to a conductive state with memory by the application of a threshold voltage, and (iii) the conductive and resistive states have different capacitance values associated therewith.

A ceramic thin film memory device according to the present invention can be fabricated by depositing a thin film derived from hydrogen silsesquioxane resin onto a first of two electrodes. A second electrode is deposited over the ceramic thin film to provide a sandwich configuration. The current-voltage relationship of the device constructed in this manner has been found to exhibit two distinctly different states of resistance, one being a state of high resistance and the other being a state of low resistance. The memory effect of the device can be realized by switching electrically between these two states of high and low resistance. Switching may be achieved by the application to the device of a suitable potential difference between the two electrodes. The potential difference may be applied either in a pulsed mode or as a slowly varying voltage. As a non-volatile memory cell, the device can be maintained in either a high state of resistance or a low state of resistance for extended periods of time in the absence of any voltage or electrical power.

Accordingly, integrated computer memory devices may be manufactured which are capable of retaining stored information without the application of auxiliary power. The memory contents of a device can be read out at a reduced voltage by merely evaluating the resistance or the capacitance of the memory device. No additional electrical connections are required for such a mode of operation, and therefore the READ/WRITE connections to a particular device may serve as the ADDRESS SELECT lines.

These features render it possible to fabricate highly integrated random access memory cell arrays by means of a simple row-column electrode geometry. Planar and stacked array configurations may be constructed in this manner.

These and other features, objects, and advantages, of the present invention will become more apparent from a consideration of the detailed description of the invention.

BRIEF DESCRIPTION OF THE DRAWINGS

FIG. 1 shows the device in its simplest form.

DETAILED DESCRIPTION OF THE INVENTION

The present invention is based on the discovery that thin films of silicon dioxide derived from hydrogen silsesquioxane resin thin films exhibit novel threshold switching and negative differential resistance (NDR), as well as stable conductive and resistive states.

Figure 1:
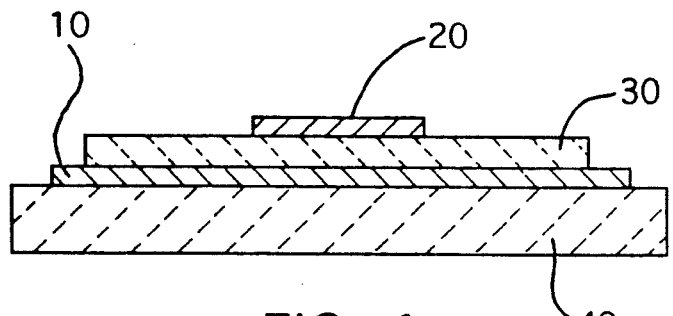
FIG. 1 is pictorial representation and a side view of a cross section of a sandwich device according to the present invention.

The invention will be described with specific reference to the drawing figures. FIG. 1 is a cross-sectional view of a representative threshold switching device of this invention wherein electrodes 10 and 20 are separated by the thin film 30. Although FIG. 1 exemplifies a sandwich electrode configuration, including a glass substrate 40, this arrangement is not critical and any configuration appropriate for a given device application may be used. For example, arrangements such as coplanar, transplanar, crossed grid arrays, and two-dimensional circular dot patterns may be used.

The shape of the electrodes 10 and 20 and the materials from which they are constructed may be any conventionally known in the art. For instance, the electrodes can be made of nearly any electrically conductive or semiconductive material such as gold, silver, aluminum, platinum, copper, gallium arsenide, chromium, and silicon. Likewise, the electrodes can be used in nearly any shape or form desired, such as a wire or a conventional lead, provided they have at least enough device area to enable the desired current flow. Particularly preferred herein is the use of gold electrodes.

Contact between the electrodes 10 and 20 and the thin film 30 can be established by techniques well known in the art. For instance, the electrodes may be formed on the thin film by evaporating or sputtering the appropriate electrode material in vacuum. Alternatively, the thin film 30 may be deposited directly onto preformed electrodes to create the appropriate contact, or the preformed electrodes may be adhered to the thin film by conventional techniques.

The thin films 30 of this invention are silicon dioxide derived from hydrogen silsesquioxane resin. Generally, these films may be of any thickness desired. Those in the range of between about 50 and 5,000 nanometer are preferred with those in the range of between about 100 and 600 nanometer being especially preferred. Such thin films 30 may be formed by coating a substrate with a solution comprising a solvent and hydrogen silsesquioxane resin, evaporating the solvent to form a preceramic coating, and then converting the preceramic coating to a thin film.

The thin film 30 is formed with the necessary electrodes 10 and 20 arranged such that a voltage can be applied across the thin film.

A device prepared in this manner initially exhibits an undefined, non-specific resistance. For instance, some devices may exhibit resistance values as low as one ohm while others exhibit values above ten megohms. Those with very low resistance often have shorts between the electrodes due to pin holes and other flaws. If present, such shorts may be "blown out" by applying a voltage sufficiently high of about 10–20 volts from a low impedance voltage source, to vaporize the electrode around the short.

A voltage is then slowly applied across the film of the device and increased until a threshold voltage is reached, at which point, the resistance of the device suddenly falls. Upon such a voltage application, the device is completely formed and it will remain in its low resistance state.

To obtain lower threshold voltages and more reproducible results, the devices of the invention may be placed in a non-oxidizing environment. Examples of suitable environments include nitrogen, argon, helium, and carbon dioxide. Alternatively, however, establishing a vacuum or encapsulating the device can also provide the desired non-oxidizing environment.

The following discussion describes the characteristics of a typical device formed in the above manner, and the procedures to switch the device from its OFF state to an ON state and back again. A typical device includes a silica thin film 30 with a thickness of about 200 nanometer and a device area of about 0.1 cm$^2$ or less. A voltage is applied across the electrodes 10 and 20, and the current through the device and the voltage across the device are measured. The current, measured in ampere (A) is converted to a current density j and reported as A/cm$^2$. The results are plotted in a diagram of current density versus voltage referred to as a jV curve. The values set forth herein are only representative of a typical device and are not meant to be limiting.

Threshold switching, as displayed by this device, is similar to that known in the art for other thin films. As a voltage less than a threshold voltage of about three volts is applied to an electrode, the thin film exhibits a high impedance as would normally be associated with an insulator. The resistivity of the device in this "OFF" state is generally in the range of between about $10^8$ ohm cm and about $10^{11}$ ohm cm. When the applied voltage is raised above the threshold voltage however, the thin film is rapidly converted to a state of low resistivity, and the device supports a high current density. The resistivity in this "ON" state is typically in the range of between about $10^4$ ohm cm and about $10^7$ ohm cm.

Figure 2:
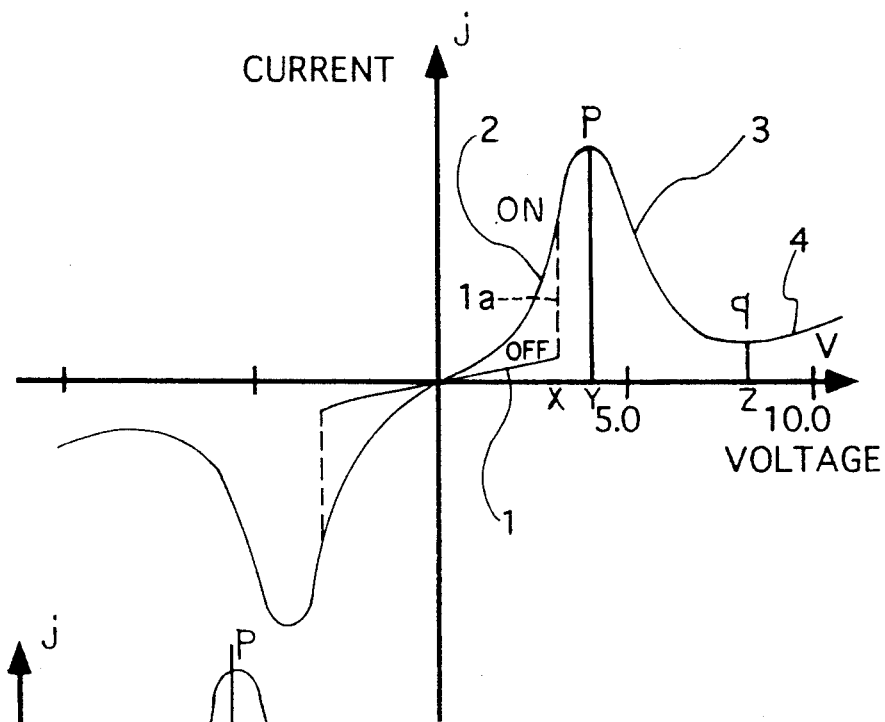
FIG. 2 is a graphical representation in the form of a jV plot of the current density versus the voltage of a device of the present invention illustrating the threshold switching behavior of the device. Current density j is defined as the current in ampere units divided by the surface area of the device in square centimeters.

This threshold switching behavior is graphically displayed in FIG. 2. Line 1 shows that when the device is in the OFF state, the current density increases only slightly as the applied voltage is increased. When the applied voltage reaches the threshold voltage "x" the device rapidly switches from the OFF state to the ON state wherein the current density is suddenly increased by two or three orders of magnitude or more shown by the dotted line. It is essential for the transition to the ON state to occur as depicted schematically in FIG. 2, that the ambient of the device be free of oxygen or other oxidizing gaseous species. This condition pertains throughout the remainder of the discussion of the resistive properties of devices according to this invention.

Figure 3:
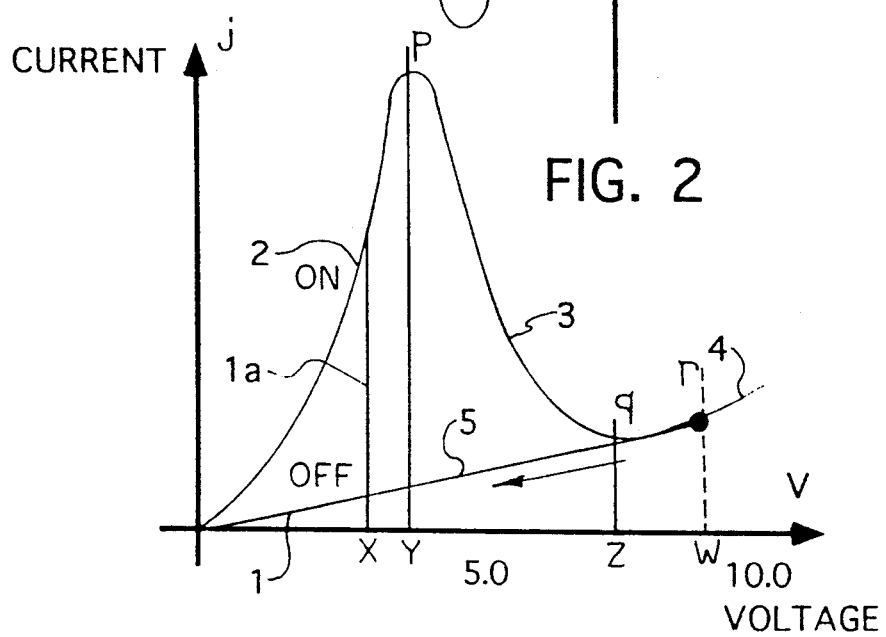
FIG. 3 is graphical representation of a portion of the jV plot of FIG. 2 in more detail.

As can be seen in FIGS. 2 and 3, jV curves for such devices exhibit both linear and non-linear components dependent upon the state of the device.

Once in the ON state, the jV tracing follows lines 2, 3 and 4 wherein the current rises steeply with voltage in the first quadrant as shown by line 2 and symmetrically to it in the third quadrant until it reaches a maximum current "p" at a voltage "y". Increasing the voltage beyond this value results in a decrease in current density until a minimum "q" is reached at voltage "z", at which time the device exhibits a voltage controlled negative differential resistance, or NDR as shown by line 3. Typically the values for "y" range between 4–6 V and for "z" between 8–10 V. At voltages above "z", the jV curve shows the high resistivity characteristic of an insulator which is shown as line 4.

One advantage of a device of this invention is the fact that the jV curve is wide and "stable" in the NDR region, such that no uncontrollable transitions occur as the applied voltage is changed, although the jV curve is noisier in the NDR than in the low voltage portion shown as line 2. Thus, any point on the jV curve can be isolated and maintained, provided the source impedance of the voltage supply is smaller by magnitude than the negative differential resistance of the device at that point.

The jV curve of the device in its ON state can be completely traced out for both increasing and decreasing voltages, through the maximum, at a sufficiently low rate of change of the applied voltage. In particular, the curve is continuous through the origin which means (i) there is no holding current necessary to maintain the ON state, and (ii) the device has a "memory" of the ON state even when no voltage is applied.

To convert the device from the ON state to the OFF state requires that the applied voltage be removed or reduced to a value of about zero at a sufficiently high "slew rate" from a voltage above "z". As shown in FIG. 3, the jV curve of the device does not go through the current peak "p" when the applied voltage is rapidly lowered in this manner. Rather, it follows a direct nearly linear path shown by line 5. Slew rates for efficiently switching the device OFF are greater than about one volt per millisecond with rates greater than about 1000 V/mS being preferred. It is to be noted that a device in the ON state may be turned OFF by a voltage pulse starting at zero, provided the pulse voltage is larger, or approximately equal to "z" wherein the pulse reaches line 4, and the fall time of the pulse meets the slew rate requirement. Typically, a voltage of ten volts for a duration of one microsecond or less is adequate.

When the device is turned OFF in the above manner, it has a high resistance, typically two or three orders of magnitude higher than its resistance in the ON state. The resistance can be determined by measuring the jV curve in the OFF state over a small range of the applied voltage up to the threshold voltage. The device will remain in the OFF state as long as the applied voltage does not exceed the threshold voltage. Such a device in the OFF state can be converted to the ON state as described above.

Figure 4:
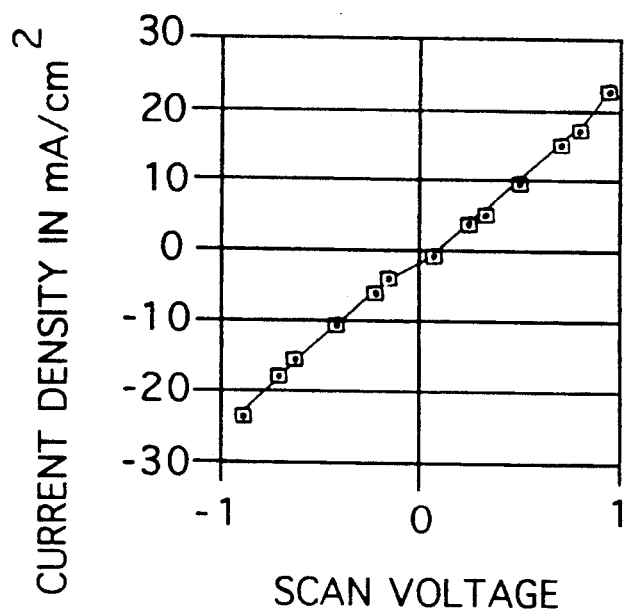
FIG. 4 is a graphical representation in the form of a jV plot of a device of the present invention having an area of 0.15 square centimeters illustrating a probe scan of the ON state of such a device.
Figure 5:
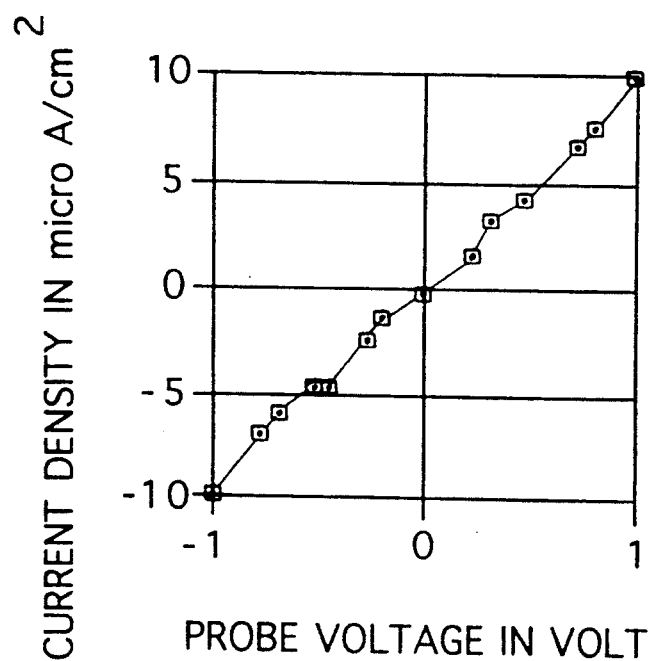
FIG. 5 is similar to FIG. 4 but in the form of a graphical representation of a jV plot of a device of the present invention having an area of 0.15 square centimeters illustrating a probe scan of the OFF state of such a device.

Both the ON state and the OFF state of a device are illustrated in FIGS. 4 and 5 respectively, which show measurements of the jV characteristics over a range of the applied voltage between −1 V and +1 V. From the device area A (0.15 cm$^2$) and the current densities $j_{ON}$ and $j_{OFF}$ obtained at a specific voltage, for instance U=1 V, the resistance $R_{ON}$ and $R_{OFF}$ of the device in its two states can be calculated as:

$$R_{ON} = U/j_{ON}A \text{ and } R_{OFF} = U/j_{OFF}A.$$

With the values from FIGS. 4 and 5, the ON resistance is calculated as 270 ohm, while for the OFF resistance the value is 670 kilo-ohm. The resistance ratio achieved with this device is 2480.

As set forth above, these resistances can be readily interchanged by the application of appropriate voltage pulses. At voltages below the threshold voltage, the resistance values of the device are stable.

Figure 6:
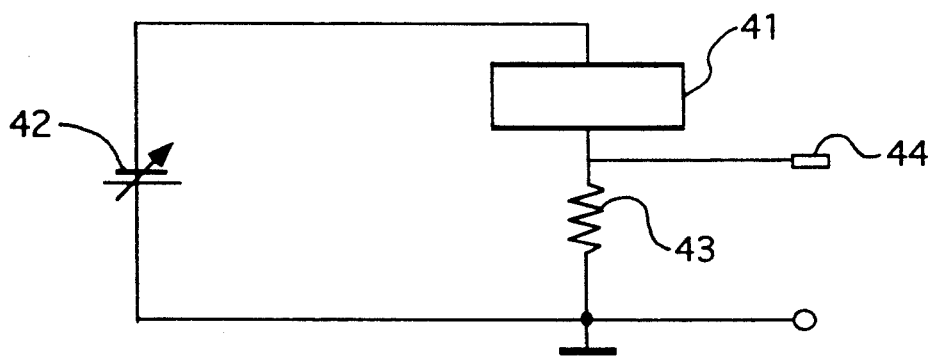
FIG. 6 is another schematic wiring diagram of a ceramic thin film device according to the present invention arranged in a test circuit, in which the device functions as a memory element in a memory circuit application of the device.

A ceramic thin film memory device in accordance with the present invention is shown in FIG. 6, in which there is depicted a two terminal switching device 41 which functions as a memory element. The two terminal switching device 41 is adapted to be used in conjunction with a plurality of other identical devices 41, which can be interconnected into an array for the purpose of forming digital memory circuits for electronic computer applications. Such arrays are shown in FIGS. 7–11.

The electrical arrangement for a single switching device 41 as a memory element is shown in FIG. 6 as a simple test circuit, which enables the device 41 to function as a memory element in a memory circuit application. As can be seen in FIG. 6, the hydrogen silsesquioxane resin derived thin film device 41 is connected to a voltage supply 42 which includes appropriate electronic controls. The voltage supply 42 may constitute either a variable voltage source or a voltage pulse source. The circuit in FIG. 6 includes a load resistor 43 having a value of $R_{ld}$ which is connected in series with the device 41. The circuit in FIG. 6 further includes an appropriate data output line or terminal 44.

The voltage source 42 can be realized as the power supply with the use of suitable circuitry designed to perform the MEMORY READ and MEMORY WRITE functions which will be described in more detail hereinafter. A logical signal is available at the data output line 44 in the form of either a high voltage logical "1" or as a low voltage logical "0". The form of the logical signal will depend upon the specifications of the particular logic family from which it is implemented.

Arrays of the device 41 of FIG. 6 may be fabricated by depositing a thin film of hydrogen silsesquioxane resin onto a substrate. Suitable substrates include materials such as silicon wafers, ceramics, or glass. It is preferred to employ substrates which have been provided with a pattern of electrodes in accordance with procedures known in the field of integrated circuit technology. The deposited thin film is converted to silica in accordance with procedures explained above.

Figure 7:
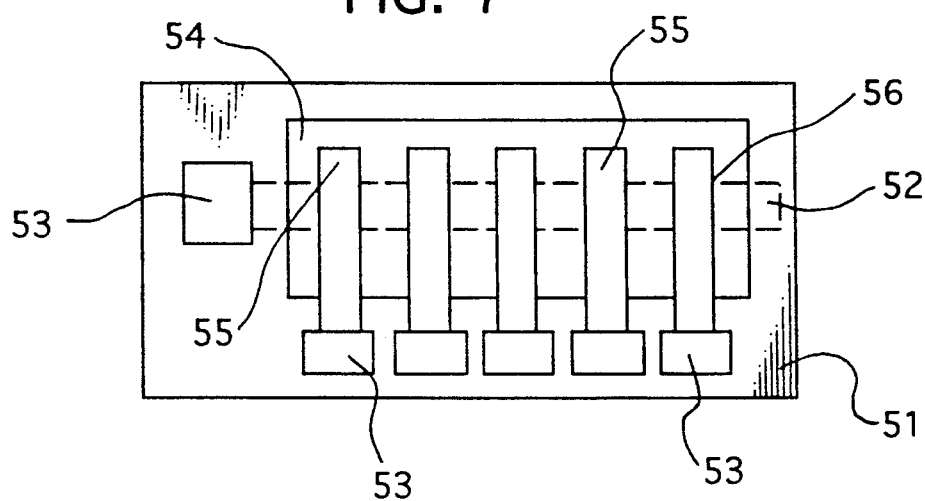
FIG. 7 is a pictorial representation of an array of memory cells in which the array is formed from a number of the ceramic thin film devices shown in FIG. 1.

Thus, FIG. 7 illustrates an array of memory cells 56 including a bottom electrode 52 which is common to all of the cells 56 in order to enable row selection, and top electrodes 55 connected to each memory cell 56. Each memory cell 56 is defined by an area of the silica thin film which is sandwiched between the electrodes 52 and 55. Each memory cell or binary memory element 56 functions as a storage element for one bit in the array. The array of memory cells 56 in FIG. 7 further includes contact pads 53, and a substrate 51 formed of a silicon wafer, a ceramic, or a glass material. The hydrogen silsesquioxane resin derived silica thin film is shown at 54.

Figure 8:
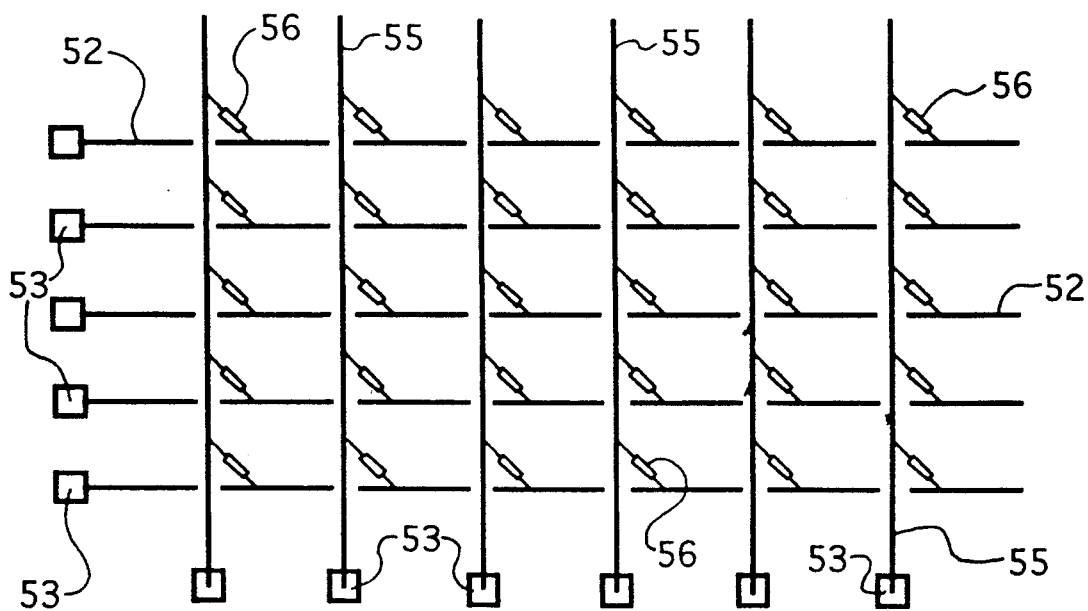
FIG. 8 is a pictorial representation of an alternate embodiment of an array of memory cells of the silica thin film devices derived from hydrogen silsesquioxane resin, but in which the array in this figure is configured in the form of a two dimensional arrangement.

In accordance with an alternate embodiment, an array of memory cells 56 is illustrated in FIG. 8. FIG. 8 shows a two dimensional memory cell array arrangement configured in accordance with FIG. 7, but in which the number of rows and columns formed by the electrodes 52 and 55 has been increased. Additionally, and as shown in FIG. 8, there has been integrated into the array memory cell selection circuitry which is both in-line and along the peripheral contact pad area 53. The individual memory cell devices 56 in FIG. 8 have been represented pictorially as small rectangles 56, and each device 56 is shown to be electrically connected between the rows formed by the electrodes 52 and the columns formed by the electrodes 55. In such a construction, the individual memory cells 56 are shown to be fabricated onto a single hydrogen silsesquioxane resin derived silica sheet 54, with the metal electrodes 52 and 55 intersecting above and below the silica sheet material. Electronic circuitry necessary for addressing has not been shown in FIG. 8.

Three-dimensional memory cell arrays may be constructed such that each layer is able to function as the substrate for the next succeeding layer. Staggering of address decoding circuitry may be necessary for decoupling in the case of a three dimensional memory cell array.

When employed as a memory cell in the test circuit of FIG. 6, two unique features of the device 41 are utilized. Thus, the device 41 possesses either a high OFF or a low ON resistance which correspond to storage of the binary information "0" or "1", respectively. Secondly, the resistance of the device 41, and thus the memory content of the memory cell, may be changed by the application to the device 41 of a voltage pulse of suitable amplitude and duration.

A procedure for measuring the resistance value of the device 41, and a procedure for changing the resistance between its highest value where the device is OFF and its lowest value where the device is ON, is set forth below.

A. Measurement of Resistance

In FIG. 6, a query voltage $U_{qr}$ was applied to the memory cell device 41. The voltage U was in a voltage range such that the limits of the threshold voltage "x" was not exceeded. Typically, the threshold voltage is within the range of plus or minus 1.0 to 2.0 volt across the device 41 in either polarity. Current I flowing through the device 41 was measured from the voltage across load resistor 43 as it appeared at the output data line 44.

FIGS. 4 and 5 show measurements of the current of the device 41 in its ON state and in its OFF state respectively, as a function of the voltage V. Rather than establishing a complete IV curve, only one current reading was taken at an applied test voltage. The ON resistance was found to be 270 ohm. The OFF resistance was found to be 670 kilo-ohm. From this data, the value $R_{ld}$ of the load resistor 43 was calculated in order to ensure the performance requirements of the device 41 in a logical memory circuit application. A suitable value is given by the geometric mean of these values. Thus, $R_{ld}$ had a value of about 15 kilo-ohm.

For a voltage of two volt, a value of $R_{ld}$ of 15 kilo-ohm provides an output voltage of less than 50 mV, for example about 44 mV, when the device 41 is OFF, and an output voltage of about two volt when the device 41 is ON. A subsequent signal amplifier (not shown) can be used to change the level of the output to that compatible with conventional logic circuits (TTL or CMOS).

B. Change of Resistance

The resistance of the device 41 in FIG. 6 was changed by application to the device of a voltage of three volt which is in excess of the threshold voltage "x". It should be noted that during this procedure, and as previously explained, it is important to remove the applied voltage in one step rather than to slowly lower the applied voltage. A voltage pulse with a rise and fall time of a few milliseconds or less has been found to be suitable for these purposes.

The resistance value attained by the device 41 following the application of the voltage pulse is dependent on the value of the pulse voltage. Thus, by changing the resistance of the device 41 in a memory circuit application, either a logical "1" or a logical "0" can be stored in the memory cell device 41.

In addition, both the logical "1" and the logical "0" can be read out at the data output line 44 in FIG. 6. Voltage pulses can be conveniently applied to the same two electrodes which constitute the contacts of the device 41, and therefore no additional control electrodes are required.

Figure 9:
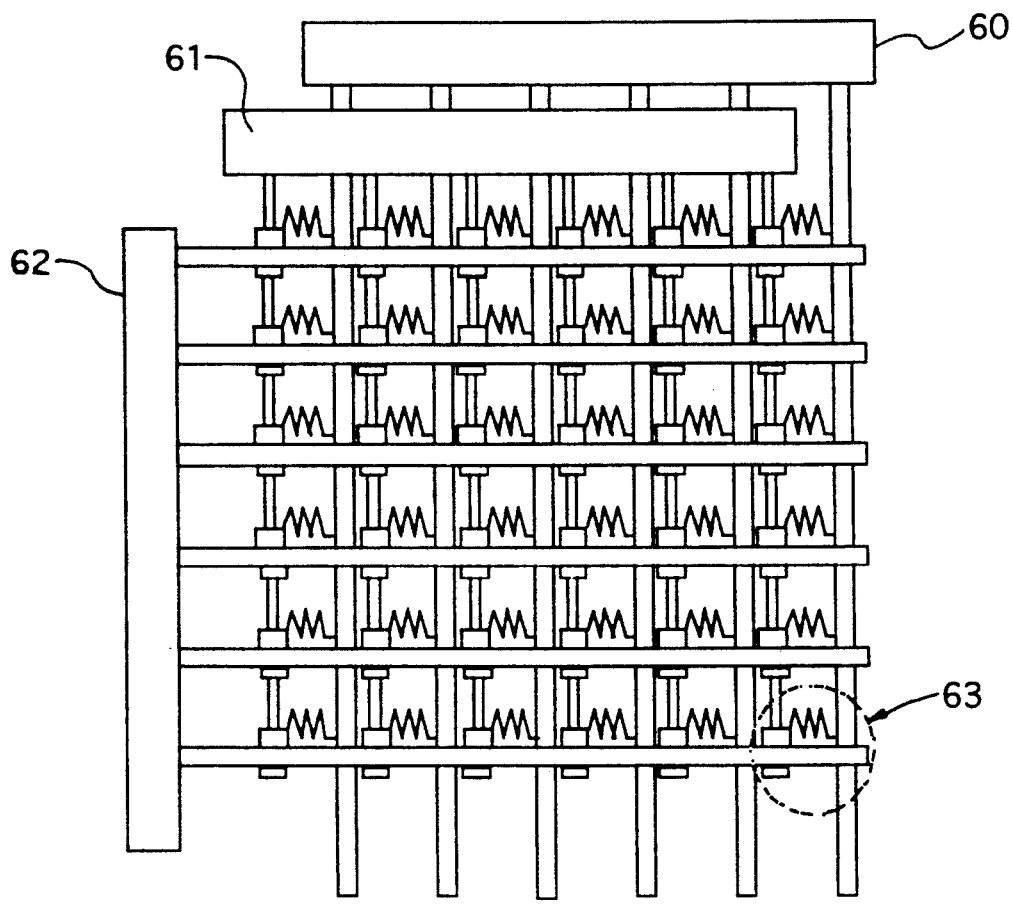
FIG. 9 is a pictorial representation similar to FIG. 8 of an integrated memory array in more detail of several passive thin film memory devices shown in FIG. 6 according to the concepts of the present invention.

A more detailed embodiment of the present invention is shown in the form of an integrated memory array of passive thin film memory devices 63 in FIG. 9. In FIG. 9, the integrated array is shown to include the interconnection and interrelationship between address select logic circuitry 60, read-out control logic circuitry 61, and write control circuitry 62 with address selection.

Figure 9A:
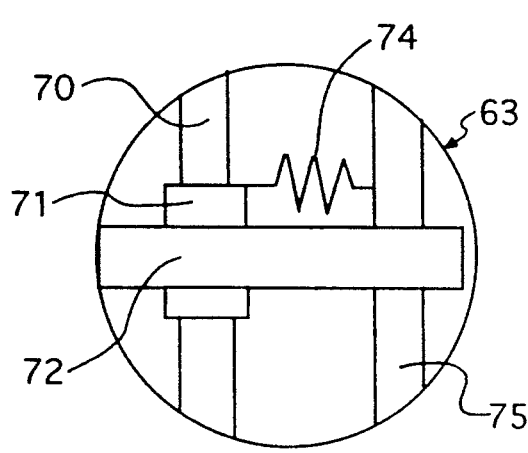
FIG. 9A is an enlarged view of a single one of the passive thin film memory devices shown in FIG. 9 which constitute a memory element of the integrated memory array of FIG. 9.

Details of a single device 63 are shown on an enlarged scale in FIG. 9A, which can be seen to include for each device 63, a read-out line 70 and a signal ground or cell address 75. The device 63 in FIG. 9A further includes a bottom memory electrode 71, a top address select and cell electrode 72, and an integrated load resistor 74.

Figure 9B:
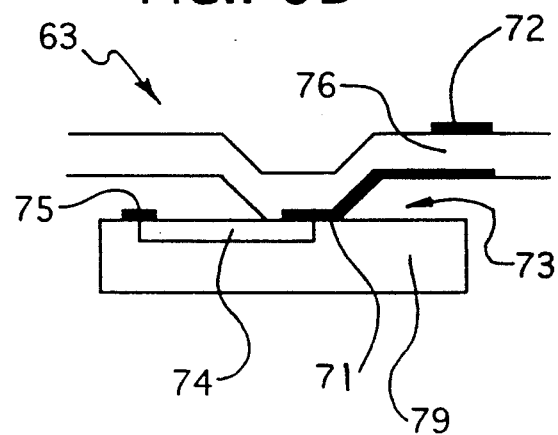
FIG. 9B is a more detailed pictorial representation and a cross sectional view of the passive thin film memory device of FIG. 9A. In this figure, the device of FIG. 9A is illustrated in a ninety degree re-orientation from the device as it is shown in FIG. 9A, for purposes of clarity.

Additional features and details of the device 63 of FIGS. 9 and 9A are illustrated in FIG. 9B, which is a view partly in cross-section of the device 63 of FIG. 9A re-oriented by ninety degrees. Thus, a silicon wafer 79 provides the support for the integrated load resistor 74, the bottom memory electrode 71, and the signal ground 75. The silica thin film memory device 76 which is derived from hydrogen silsesquioxane resin, is interposed between the top address select and cell electrode 72 and the bottom memory electrode 71. A suitable dielectric layer 73 is disposed intermediate the silicon wafer 79 and the bottom memory electrode 71.

Figure 10:
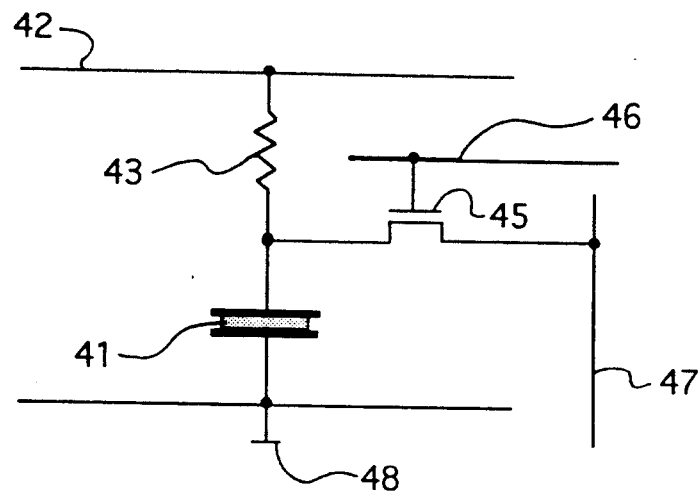
FIG. 10 is yet another schematic wiring diagram of an alternate embodiment of a ceramic thin film device according to the present invention arranged in a memory cell configuration with common address select circuitry added.

An alternate electrical arrangement for a single switching device 41 as a memory element is shown in FIG. 10, as a circuit which enables the device to utilize integration technology and logical interfaces established in the semiconductor industry for Random Access Memory (RAM) applications. Where the arrangement of FIG. 10 includes parts similar to those in the arrangement of FIG. 6, identical numerals have been used to identify the same parts.

Thus, it can be seen that the embodiment of FIG. 10 depicts a schematic of a storage unit for a RAM cell (static memory cell) based on the hydrogen silsesquioxane resin derived silica switching device of the invention as the active storage element. FIG. 10 differs from FIG. 6 in that the data output line or terminal 44 of FIG. 6 has been replaced in FIG. 10 by access transistor 45, wordline 46, and bitline 47. The access transistor 45 constitutes an n-channel MOSFET, and the polysilicon load resistor 43 has a value close to the geometric mean of the ON and OFF resistance of the memory cell 41. Access to the memory cell 41 can be controlled by the wordline 46. Data input and output is through the bitline 47. The query supply voltage 42 has a value below the threshold voltage of the memory cell 41.

Arrays of the memory cell 41 of FIG. 10 may be fabricated by depositing a hydrogen silsesquioxane resin onto the topography of an integrated circuit on a silicon wafer containing the various auxiliary elements depicted in FIG. 10. The deposited thin film is converted to silica in accordance with the procedure outlined previously, and a top electrode is applied to the device to complete the formation of the switching device.

Figure 11:
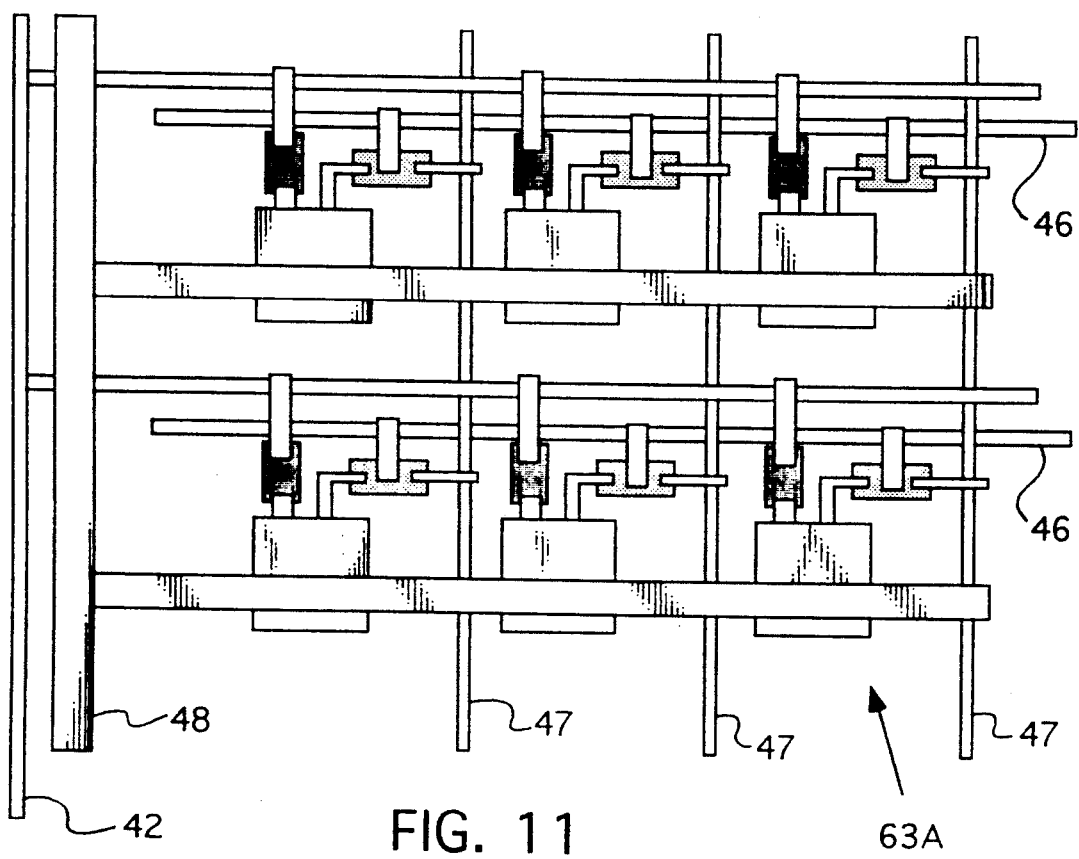
FIG. 11 is a pictorial representation similar to FIG. 9 of an integrated memory array of several passive thin film memory devices as shown in the embodiment of FIG. 10 according to the concepts of the present invention.

Thus, FIG. 11 illustrates an integrated RAM cell array including individual hydrogen silsesquioxane resin derived silica switching devices 63A as the active storage elements. The array further constitutes query voltage supply 42, wordlines 46, bitlines 47, and ground 48. Such an arrangement enables the devices of the present invention to be employed in very large memory arrays where decoupling between memory cells 41 becomes significant.

Figure 11A:
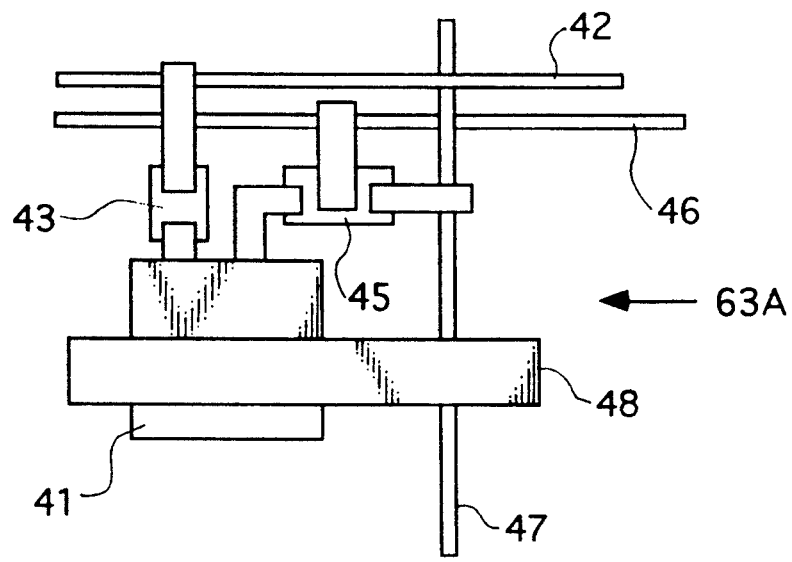
FIG. 11A is a top view of the integration elements of one of the ceramic thin film memory devices with the auxiliary circuit elements as shown in FIG. 10 which constitute one of the memory elements of the integrated memory array of FIG. 11.
Figure 11B:
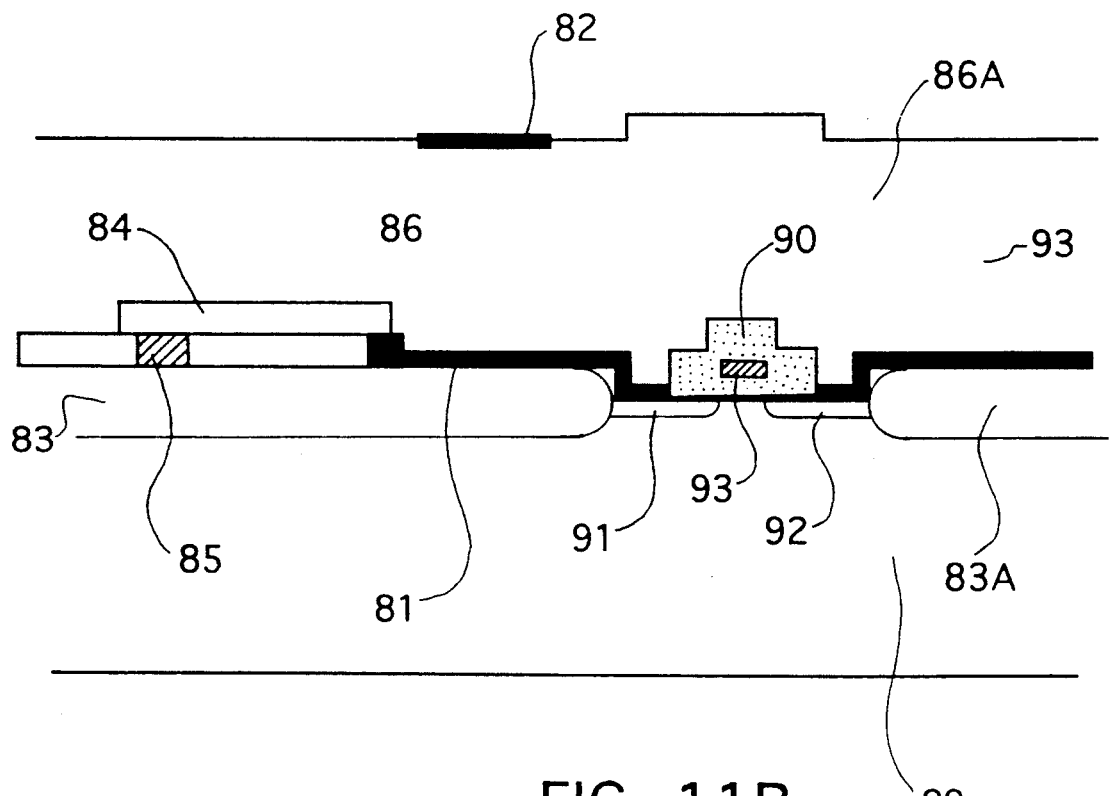
FIG. 11B is a cross sectional view of the integration elements of the ceramic thin film memory device of FIG. 11A. In this figure, the elements of FIG. 11A are displayed in a linear fashion rather than in a two-dimensional arrangement for clarity.

The details of an individual device 63A of FIG. 11 are set forth on a much enlarged scale in FIGS. 11A and 11B which are a top view and a cross-sectional view respectively of the geometry of a memory element in the integrated circuit of FIG. 11.

In the top view of FIG. 11A showing the RAM cell including the various elements integrated on a silicon wafer substrate, identical numerals are used to identify the same parts as FIG. 10. Thus, FIG. 11A includes query voltage supply 42, circuit ground 48, the memory element 41, load resistor 43, access transistor 45, wordline 46, and bitline 47.

On a much enlarged scale, the static RAM cell with load resistor and word select transistor is depicted in FIG. 11B as a cross section for VLSI integration. In FIG. 11B, the load resistor 43 shown generally in FIG. 11A, will be seen to include field oxide 83, a polysilicon layer 84, and the query voltage supply 85. Similarly, the memory cell 41 shown generally in FIG. 11A, will be seen in FIG. 11B to include memory cell electrode 81, ground 82, the cell 86 of hydrogen silsesquioxane resin derived silica 86A. In addition, the access transistor 45 shown generally in FIG. 11A, will be seen in FIG. 11B to include gate oxide 90, source 91, drain 92, and gate 93 to wordline 46. The static RAM cell of FIG. 11B also includes the silicon wafer 89.

The arrangement of FIGS. 11, 11A, and 11B, is capable of writing data and reading data. To write into the cell, the wordline 46 has to be pulled to a high potential, turning access transistor 45 on and connecting the memory cell electrode 81 to the bitline 47. Writing is accomplished either (i) by applying a voltage pulse of small amplitude above the threshold voltage to the bitline 47 to turn the device ON (logic "1"); or (ii) by applying a high voltage pulse beyond the NDR region with a sufficiently high slew rate to the bitline 47 to turn the device OFF (logic "0"). The voltage query line 42 may be at a nominal value below the threshold voltage, typically 1 to 2 volt, during either of the WRITE operations, or it may be at ground potential or optionally floating. Data storage is static and no refreshing is required, and it does not require a connected power supply voltage to retain the stored information. Thus, there is no power dissipation.

To read data that is stored in the cell, the wordline 46 has to be pulled high first. Then, or previously, the query voltage is applied. The query voltage must be less than the threshold voltage of the device. The bitline 47 will then go, or be either (i) high and close to the query voltage, or (ii) low and close to ground potential; depending upon whether a logic 1 or a logic 0 was stored in the cell. A suitable column decoder can be employed to connect this low level signal to a comparator/amplifier in order to route the signal to, and adjust it to logic levels, of the output circuit.

The use of a silica thin film derived from hydrogen silsesquioxane resin in a memory element according to the present invention is believed to be novel. These memory elements can be distinguished from those existing in the state of the art by a consideration of the unique features they offer for the design and the operation of a random access memory circuit as follows.

A device according to the present invention can assume two different stable states. The ON state provides a low resistance to current flow, the OFF state, a high resistance, the two states having a resistance ratio of 1000 or more. Transitions between the two states are induced by the application of voltage pulses of suitable amplitude, duration, and slew rate.

Thus, a memory element in its simplest form consists of only the device with its two electrodes through which the resistance of the device is measured in order to read the stored memory contents (low resistance ON for logic "1", high resistance OFF for logic "0"), and through which also the voltage pulses are applied to change the memory contents. No other circuit components are required for a fully functional memory element.

This memory element constitutes a non-volatile random access memory since the information written into it is stored permanently even in the absence of a holding voltage or refresh cycle such as is required to maintain a conventional memory circuit. Thus, there occurs no power dissipation in even very large arrays of these memory elements during periods where neither READ nor WRITE access is made, as with dynamic random access memory (DRAM).

In READ mode, only a low voltage of typically 1 V across the device is needed to assess its state which, in the ON state, has a resistance of the order of 1 kΩ so that the power dissipation in a typical device in this mode is negligible. Similar values obtain for the WRITE mode where voltage pulses of maximally 10 V are needed to switch to the OFF state which has a resistance of the order of 1 MΩ.

Where the minimal memory circuit configuration described and discussed above provides a fully functional memory, it is not in this form compatible with existing logic circuitry. To achieve this compatibility, a load resistance and, in general, an access transistor may be added to each basic device for forming a general purpose memory element suitable for integration into memory circuits with large numbers of elements. Together with suitable WORD SELECT and BIT SELECT lines (and BLOCK SELECT in the case of 3-dimensional arrays) this design of a memory element corresponds the standardized functions of state-of-the-art memory circuits.

In distinction to state-of-the-art memory circuits, however, the design of a memory element according to the present invention requires only one basic device and, consequently, only one load resistor, one access transistor, and one bit line for each memory element while a memory element in a standard random access memory circuit (RAM) in n-type metal oxide semiconductor (NMOS) technology needs two of each of these. Another consequence of this simplified architecture is that the area each memory element occupies on the substrate in smaller than needed for conventional cells. Therefore, the complexity of the design is greatly reduced for very large memory circuits (Mbit to Gbit) which is expected to improve both, the manufacturing yield, and the reliability of its performance.

A less complete memory element design based on only the basic device in conjunction with a load resistor for each one offers another advantage of a memory circuit according to the present invention over existing memory circuit designs, namely that the memory elements can be manufactured on any dielectric substrate on which the electrodes and the load resistors, preferably in the form of polysilicon but not restricted to this form, can be deposited together with the silsesquioxane film, and on which the latter can be converted to the requisite non-dense silica as described earlier. This allows these memory elements to be utilized in situations where conventionally manufactured memory circuits cannot be used such as at high temperatures or in corrosive environments in which the silica (and the load resistor) is stable.

The thin film silica coating derived from hydrogen silsesquioxane resin can be distinguished from the many coatings existing in the state of the art by a consideration of its unique characteristics which are manifested as follows.

Initially, as a voltage below a threshold voltage "x" is applied to the device in the OFF state, the current follows an essentially linear relationship along line 1. When the threshold voltage "x" is reached however, line 1a in FIGS. 2 and 3 indicates a rapid linear transition from the OFF state of the device to ON state in which the current varies in a non-linear fashion. As the voltage is increased beyond the threshold voltage "x", a current maximum or current peak "p" is reached at voltage "y".

Once the ON characteristic of the device is established, a decrease of the voltage from "y" to zero for example, causes the current to decrease along line 2 rather than retracing lines 1a and 1. On the other hand, voltage increases beyond "y" effect a decrease of current along line 3 to the current minimum or current valley "q" at voltage "z". Horizontal tangents drawn on the curve at points "p" and "q" define the NDR or the region of negative differential resistance along line 3 between the tangents.

Until the voltage exceeds the voltage "z", the device remains in the ON state and is free to cycle slowly along lines 2 and 3. The device may be switched to the OFF state by increasing the voltage beyond "z" to "w" for example, and rapidly removing the applied voltage. This causes the current to decrease to zero at a lower current level and in an essentially linear fashion from the return point "r" in FIG. 3 in a path along lines 4, 5, and 1. The device remains in the OFF state as long as the magnitude of any subsequently applied voltage, either positive or negative, does not exceed the threshold voltage "x". If the subsequently applied voltage does exceed the threshold voltage "x", the device is switched back to the ON state.

The jV curves according to FIGS. 2 and 3 therefore can be seen to exhibit both linear and non-linear regions for a device. The jV curve has a first non-linear region 2 wherein increasing the voltage applied to the device increases the current to a current maximum or peak "p", followed by a second non-linear region of negative differential resistance 3 wherein increasing voltage applied to the device decreases the current to a current minimum or valley "q", while the voltage is increasing.

The jV curve has a third region 5 capable of being activating by a voltage in excess of the voltage "z" at the current minimum "q", at which time a rapid removal of an applied voltage "w" causes the current to decrease from point "r" in a linear fashion along lines 5 and 1.

It has been determined that the application of voltage pulses that vary between the threshold voltage "x" in FIG. 3 and the current minimum at point "q" at "z" volt in FIG. 3 results in device resistances ranging between the fully ON and the fully OFF state by comparing FIGS. 4 and 5.

The jV curve has a fourth region 1a wherein an increase of voltage applied to the device up to a threshold voltage "x" causes a rapid transition from a linear current increase to a non-linear increase in region 2 up to a current maximum or peak "p", at which peak "p" regions 2 and 3 merge.

Other variations and modifications may be made in the compounds, compositions, methods, devices, and articles of manufacture, described herein without departing from the essential features and concepts of the present invention. The forms of the invention described herein are exemplary only and are not intended as limitations on the scope of the invention as defined in the appended claims.

That which is claimed is:

1. A digital memory circuit for electronic applications comprising a circuit having at least one memory element connected to logic control circuitry, the digital memory circuit including a voltage supply and a data input/output terminal, the memory element in the digital memory circuit being substantially in the form of a silicon dioxide derived from the oxidation of a hydrogen silsesquioxane resin, and including electrical contacts for applying an electrical potential difference across the film, the silicon dioxide film being characterized by a conductive and a resistive state between which transitions can be induced by the application of voltage pulses, the silicon dioxide film being further characterized by a jV curve which includes both linear and non-linear regions for the memory element, the jV curve of the silicon dioxide film including: (i) a first non-linear region wherein increasing the voltage applied to the memory element increases the current to a current maximum; followed by (ii) a second non-linear region of a negative differential resistance wherein increasing voltage applied to the memory element decreases the current to a current minimum while the voltage is increasing; the jV curve of the silicon dioxide film including (iii) a third region capable of being activated by a voltage in excess of the voltage at the current minimum, up to which a rapid removal of the excess voltage causes the current to decrease in a linear fashion; and the jV curve of the silicon dioxide film including (iv) a fourth region wherein an increase of voltage applied to the memory element up to a threshold voltage causes a rapid transition from an essentially linear current increase to a non-linear current increase which continues to the current maximum.

2. The circuit of claim 1 wherein the film is placed in a non-oxidizing atmosphere.

3. The circuit of claim 1 in which a plurality of silicon dioxide memory elements derived from the oxidation of a hydrogen silsesquioxane resin are arranged in the circuit in rows and columns as an array.

4. The circuit of claim 3 in which the array of memory elements includes at least one row electrode common to each of the memory elements in the one row of the array, and a plurality of other separate electrodes connected individually to each memory element in the array.

5. The circuit of claim 4 in which the array further includes address select logic circuitry, write control circuitry with address selection, and read-out control logic circuitry, the circuitry being interconnected with each memory element in the array.

6. The circuit of claim 5 in which each memory element in the array is supported by a silicon wafer, the electrode common to each memory element in the array being connected to one surface of the silicon dioxide film, the separate electrode of each memory element being connected to the other surface of the silicon dioxide film, and the load resistor and address select element of each memory element being disposed on the silicon wafer in contact with one electrode of each memory element.

7. A digital memory circuit for electronic applications comprising a circuit having at least one memory element connected in series with a load resistor, the digital memory circuit including a voltage supply and a data output terminal, the memory element in the digital memory circuit being substantially in the form of a silicon dioxide derived from the oxidation of a hydrogen silsesquioxane resin, the silicon dioxide film being characterized by a conductive and a resistive state between which transitions can be induced by the application of voltage pulses.

8. The circuit of claim 7 in which a plurality of silicon dioxide memory elements derived from the oxidation of a hydrogen silsesquioxane resin are arranged in the circuit in rows and columns as an array.

9. The circuit of claim 8 in which the array of memory elements includes at least one electrode common to each of the memory elements in the array, and a plurality of other separate electrodes connected individually to each memory element in the array.

10. The circuit of claim 9 in which the array further includes address select logic circuitry, write control circuitry with address selection, and read-out control logic circuitry, the circuitry being interconnected with each memory element in the array.

11. The circuit of claim 10 in which each memory element in the array is supported by a silicon wafer, the electrode common to each memory element in the array being connected to one surface of the silicon dioxide film, the separate electrode of each memory element being connected to the other surface of the silicon dioxide film, and the load resistor and address select element of each memory element being disposed on the silicon wafer in contact with one electrode of each memory element.

12. An electronic circuit comprising at least one memory element which is a non-fully densified silicon dioxide derived substantially from a hydrogen silsesquioxane resin, and including electrical contacts for applying an electrical potential difference across the film, the silicon dioxide being characterized by a conductive and a resistive state between which transitions can be induced by the application of voltage pulses, the silicon dioxide film being further characterized by a jV curve which includes both linear and non-linear regions for the memory element, the jV curve of the silicon dioxide film including: (i) a first non-linear region wherein increasing the voltage applied to the memory element increases the current to a current maximum; followed by (ii) a second non-linear region of a negative differential resistance wherein increasing voltage applied to the memory element decreases the current to a current minimum while the voltage is increasing; the jV curve of the silicon dioxide film including (iii) a third region capable of being activated by a rapid removal of a voltage in excess of the current maximum; and the jV curve of the silicon dioxide film including (iv) a fourth region wherein an increase of voltage applied to the memory element up to a threshold voltage causes a rapid transition from an essentially linear current increase to a non-linear current increase which continues to the current maximum: and wherein the film is placed in an non-oxidizing atmosphere.

13. The circuit of claim 12 in which a plurality of memory elements are arranged in a one-dimensional array.

14. The circuit of claim 13 in which the array of memory elements includes at least one row electrode common to each of the memory elements in the one row of the array, and a plurality of other separate electrodes connected individually to each memory element in the array.

15. The circuit of claim 14 in which the array further includes address select logic circuitry, write control circuitry with address selection, and read-out control logic circuitry, the circuitry being interconnected with each memory element in the array.

16. The circuit of claim 15 in which each memory element in the array is supported by a silicon wafer, the electrode common to each memory element in the array being connected to one surface of the silicon dioxide film, the separate electrode of each memory element being connected to the other surface of the silicon dioxide film, and the load resistor and address select element of each memory element being disposed on the silicon wafer in contact with one electrode of each memory element.

17. An electronic circuit which performs a stand-alone function comprising at least one memory element which is a non-fully densified silicon dioxide derived substantially from a hydrogen silsesquioxane resin, and including electrical contacts for applying an electrical potential difference across the film, the silicon dioxide being characterized by a conductive and a resistive state between which transitions can be induced by the application of voltage pulses, the silicon dioxide film being further characterized by a jV curve which includes both linear and non-linear regions for the memory element, the jV curve of the silicon dioxide film including: (i) a first non-linear region wherein increasing the voltage applied to the memory element increases the current to a current maximum; followed by (ii) a second non-linear region of a negative differential resistance wherein increasing voltage applied to the memory element decreases the current to a current minimum while the voltage is increasing; the jV curve of the silicon dioxide film including (iii) a third region capable of being activated by a voltage in excess of the voltage at the current minimum, up to which a rapid removal of the excess voltage causes the current to decrease in a linear fashion; and the jV curve of the silicon dioxide film including (iv) a fourth region wherein an increase of voltage applied to the memory element up to a threshold voltage causes a rapid transition from an essentially linear current increase to a non-linear current increase which continues to the current maximum, and wherein the film is placed in a non-oxidizing atmosphere.

18. The circuit of claim 17 being integrated on a single substrate.

19. The circuit of claim 17 in which a plurality of memory elements is arranged in a one-dimensional array.

20. The circuit of claim 19 in which one-dimensional arrays of memory elements are combined and arranged to form a two-dimensional array or a three-dimensional array.

21. The circuit of claim 20 in which one-dimensional memory arrays are combined and arranged to form a two-dimensional memory array with rows and columns of memory elements.

22. The circuit of claim 21 in which two-dimensional memory arrays are stacked on top of each other to form a three-dimensional memory array with layers of memory elements.

23. The circuit of claim 19 in which the array further includes WRITE and READ control circuitry, the circuitry being interconnected with each memory element in the array.

24. The circuit of claim 23 in which the array further includes address select logic circuitry and WRITE and READ control circuitry, the circuitry being interconnected with the memory elements in the array.

25. The circuit of claim 17 in which the memory element is supported by a silicon wafer.

26. The circuit of claim 17 in which at least one of the electrodes forming the memory element is polysilicon.

27. The circuit of claim 17 in which the memory element is connected to a load resistor and a query voltage supply line, the load resistor being a data line for writing to the memory element and reading the memory content.

28. The circuit of claim 19 in which the memory elements are each connected to a load resistor and to a common query voltage supply line, the load resistors comprising data lines for writing to each memory element and reading its memory content, the data lines being mutually perpendicular sets connected to common rails forming the address grid.

29. The circuit of claim 21 in which each memory element is connected to word select transistor and word select lines connecting each row and each column to address select and read/write circuitry.

30. A digital memory circuit for electronic applications comprising a circuit having at least one memory element connected in series with a load resistor, the digital memory circuit including a voltage supply and a data output terminal, the memory element in the digital memory circuit being substantially in the form of a silicon dioxide derived from the oxidation of a hydrogen silsesquioxane resin, the silicon dioxide film being characterized by a jV curve which includes both linear and nonlinear regions for the memory element, the jV curve of the silicon dioxide film including: (i) a first non-linear region wherein increasing the voltage applied to the memory element increases the current to a current maximum; followed by (ii) a second non-linear region of a negative differential resistance wherein increasing voltage applied to the memory element decreases the current to a current minimum while the voltage is increasing; the jV curve of the silicon dioxide film including (iii) a third region capable of being activated by a voltage in excess of the voltage at the current minimum, at which time a rapid removal of the excess voltage causes the current to decrease in a linear fashion; and the jV curve of the silicon dioxide film including (iv) a fourth region wherein an increase of voltage applied to the memory element up to a threshold voltage causes a rapid transition from a linear current increase to a non-linear current increase which continues to the current maximum.

* * * * *